US008681501B2

(12) United States Patent  
Govindasamy et al.

(10) Patent No.: US 8,681,501 B2  
(45) Date of Patent: Mar. 25, 2014

(54) HEAT DISSIPATION UNIT FOR A WIRELESS NETWORK DEVICE

(75) Inventors: Gururaj Govindasamy, San Ramon, CA (US); Thomas Nguyen, Fremont, CA (US); Hogan Lew, Sunnyvale, CA (US); David Fraticelli, Fremont, CA (US)

(73) Assignee: Aruba Networks, Inc., Sunnyvale, CA (US)

( * ) Notice: Subject to any disclaimer, the term of this patent is extended or adjusted under 35 U.S.C. 154(b) by 389 days.

(21) Appl. No.: 12/971,962

(22) Filed: Dec. 17, 2010

(65) Prior Publication Data

US 2012/0155015 A1 Jun. 21, 2012

(51) Int. Cl.  
*H05K 7/20* (2006.01)

(52) U.S. Cl.  
USPC ...... 361/710; 361/679.54; 361/692; 361/709; 361/714; 312/223.2; 174/16.3; 174/17 R; 174/548

(58) Field of Classification Search  
USPC ............ 361/679.46–679.51, 688–697, 361/701–704, 707–710, 714–722, 752  
See application file for complete search history.

(56) References Cited

U.S. PATENT DOCUMENTS

| | | | |
|---|---|---|---|
| 5,353,191 A | 10/1994 | Volz et al. | |
| 5,842,514 A | 12/1998 | Zapach et al. | |
| 6,147,859 A * | 11/2000 | Abboud | 361/679.39 |
| 6,510,226 B1 | 1/2003 | Thomann et al. | |
| 6,864,573 B2 | 3/2005 | Robertson et al. | |
| 6,934,150 B2 * | 8/2005 | Kitchen et al. | 361/679.33 |
| 7,019,974 B2 | 3/2006 | Lee et al. | |
| 7,423,875 B2 * | 9/2008 | Huang et al. | 361/699 |
| 7,747,272 B2 | 6/2010 | Parsa | |
| 7,817,428 B2 * | 10/2010 | Greer et al. | 361/720 |
| 7,848,105 B2 * | 12/2010 | Holmes et al. | 361/695 |
| 7,859,837 B2 * | 12/2010 | Nemoz et al. | 361/690 |
| 7,898,810 B2 * | 3/2011 | Mason et al. | 361/717 |
| 7,903,412 B2 * | 3/2011 | Spivey | 361/704 |
| 7,990,726 B2 * | 8/2011 | Izuhara et al. | 361/732 |
| 8,279,604 B2 * | 10/2012 | Jones et al. | 361/703 |
| 8,422,232 B2 * | 4/2013 | Kwak et al. | 361/710 |
| 2006/0082973 A1 * | 4/2006 | Egbert et al. | 361/709 |
| 2006/0133033 A1 * | 6/2006 | Straub et al. | 361/690 |

OTHER PUBLICATIONS

International Patent Application No. PCT/US2011/04001, The International Search Report and the Written Opinion of the International Searching Authority, mailed Oct. 20, 2011.

* cited by examiner

*Primary Examiner* — Courtney Smith  
(74) *Attorney, Agent, or Firm* — Varun A. Shah (57) ABSTRACT

According to one embodiment of the invention, an apparatus comprises a heat dissipation unit, such as a heat sink, that encases wireless logic in order to completely surround such logic. When adapted as a wireless network device, a casing further encases the heat dissipation unit. The casing includes a plurality of slots that are aligned with heat-radiating elements positioned around the periphery of the heat dissipation unit to allow for cooling by convection.

26 Claims, 8 Drawing Sheets

HEAT DISSIPATION UNIT FOR A WIRELESS NETWORK DEVICE

FIELD

Embodiments of the invention relate to the field of communications, and in particular, to a heat dissipation unit for a wireless network device.

GENERAL BACKGROUND

Over the last decade or so, electronic devices responsible for establishing and maintaining wireless connectivity within a wireless network have increased in complexity. For instance, wireless electronic devices now support greater processing speeds and provide greater functionality. As a by-product of this increase in complexity, the amount of heat generated by processors and other circuitry forming the wireless electronic device has increased as well. Without proper heat dissipation, circuitry within these wireless electronic devices will exceed thermal thresholds more often, which will likely cause the device to operate less efficiently.

Currently, a number of heat dissipation measures are used for discharging heat from circuitry within a wireless network device. For example, heat sinks are one means for cooling such circuitry. Conventionally, a heat sink is a device that is directly attached to a semiconductor chip to keep it from overheating by convecting the heat generated from the chip to an ambient environment (e.g., air).

Basic components of a heat sink include (i) a heat spreader which makes thermal contact with the chip normally through a thermally conductive adhesive and (ii) a set of fins connected to the heat spreader and oriented upward to provide for convection of heat from the chip to the ambient environment. Herein, the purpose of the heat spreader is to provide good thermal conduction of heat emanating from the chip to the plurality of fins. The fins provide greater surface area for convection cooling.

However, in order to provide proper cooling for more advanced electronic circuitry, it is likely that multiple conventional heat sinks of different sizes will need to be deployed, which increases the cost of manufacture and is detrimental from a design perspective in that larger casings would be required in order to provide sufficient airflow for these heat sinks.

BRIEF DESCRIPTION OF THE DRAWINGS

The invention may best be understood by referring to the following description and accompanying drawings that are used to illustrate embodiments of the invention.

DETAILED DESCRIPTION

Embodiments of the invention relate to a wireless network device comprising a casing and a heat dissipation unit which encases wireless logic and operates in concert with the casing to dissipate heat generated by the wireless logic by convection. The heat dissipation unit features a plurality of sections that (i) collectively form a cavity into which wireless logic is placed and (ii) provide a heat path to a plurality of heat-radiating elements that are adapted to minimize the size of the casing but strive to increase the unit's surface area for effective cooling by convection. As described herein, the heat-radiating elements are elements positioned along a periphery of the unit and may have any of a number of form factors such as fins, pins or any geometric shape. The casing features slots predominantly aligned with the spacing areas between the heat-radiating elements. Both the casing and the heat dissipation unit feature apertures that, among other things, provide access to connectors in electrical communication with the wireless logic.

Herein, certain terminology is used to describe features of the invention. For example, the term "logic" is generally defined as hardware and/or software. As hardware, logic may include circuitry such as processing circuitry (e.g., a microprocessor, a programmable gate array, a controller, an application specific integrated circuit, etc.), wireless chipset with receiver and/or transmitter circuitry, semiconductor memory, combinatorial logic, or the like. As software, the logic may be one or more software modules, which are executable code such as an application, an applet, a routine, or one or more instructions. Software modules may be stored in any type of memory, namely suitable storage medium such as a programmable electronic circuit, a semiconductor memory device including a volatile memory (e.g., random access memory, etc.), any type of non-volatile memory (e.g., read-only memory, flash memory, a hard drive, etc.), a portable memory device (e.g., an optical disk, a Universal Serial Bus "USB" flash drive), or the like.

A "wireless network device" generally represents electronics with wireless capabilities or that support wireless communications such as an Access Point (AP), a station (e.g., any data processing equipment that is operable by a user such as a computer, cellular phone, personal digital assistant, tablet computer, etc.), a data transfer device (e.g., network switch), or the like. An "interconnect" is generally defined as a communication pathway established over an information-carrying medium. This information-carrying medium may be a physical medium (e.g., electrical wire, optical fiber, cable, bus traces, etc.), a wireless medium (e.g., air in combination with wireless signaling technology) or a combination thereof.

Certain details are set forth below in order to provide a thorough understanding of various embodiments of the invention, albeit the invention may be practiced through many embodiments other that those illustrated. Well-known logic and operations are not set forth in detail in order to avoid unnecessarily obscuring this description.

I. Network Architecture

Figure 1:
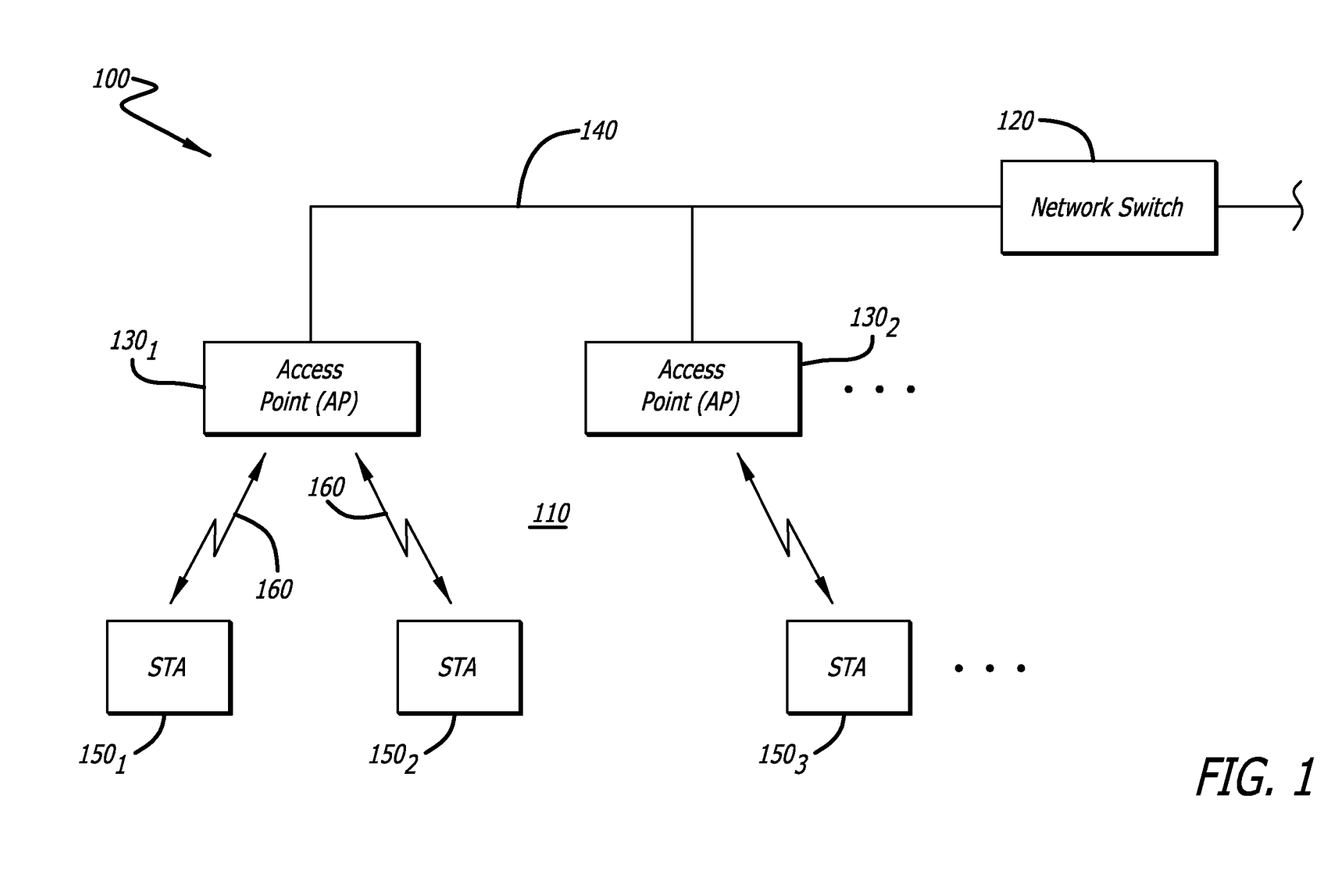
FIG. 1 is an exemplary embodiment of a wireless network including a wireless network device deploying a heat dissipation unit.

Referring to FIG. 1, an exemplary embodiment of an enterprise network 100 is shown. In accordance with one embodiment of the invention, supporting both public and private network connectivity, enterprise network 100 includes at least one local area network 110. Local area network 110 may be adapted with an enhancement that allows wireless access, thereby operating as a wireless local area network (WLAN).

As shown, WLAN 110 comprises a network switch 120 (e.g., WLAN switch) in communication with one or more wireless network devices, such as access points (APs) $130_1$-$130_X$ (where X≥1, X=2 for this embodiment) for example, over an interconnect 140. Interconnect 140 may be established using a wired and/or wireless information-carrying medium and provides either a direct or indirect communication path between APs $130_1$-$130_X$ and network switch 120.

In addition, one or more wireless stations, identified as STAs $150_1$-$150_Y$ (where Y≥1, Y=3 for this embodiment), may be in communication with APs $130_1$-$130_X$ over wireless interconnects 160. Wireless logic may be implemented as a wireless chipset within STA $150_1$-$150_Y$ or as a removable, wireless network interface card (NIC).

More specifically, for this embodiment of the invention, each AP $130_1$ or $130_2$ supports bi-directional communications by receiving wireless messages from any or all of the STAs $150_1$-$150_Y$ within its coverage area and transferring information extracted from the wireless messages over interconnect 140 to which network switch 120 is coupled. Hence, STAs $150_1$-$150_Y$ are adapted to communicate with and provide information to any associated AP $130_1$, . . . , or $130_X$.

For instance, as shown as an illustrative embodiment of a network configuration, STAs $150_1$-$150_2$ may be associated with AP $130_1$ and communicates over the air in accordance with a selected wireless communications protocol. Hence, AP $130_1$ may be adapted to operate as a transparent bridge connecting together a wireless and wired network. Similarly, STA $150_3$ may be associated with AP $130_2$.

Of course, in lieu of providing wireless transceiver functionality, it is contemplated that AP $130_1$ may only support uni-directional transmissions thereby featuring only receive (RX) or transmit (TX) functionality.

Although not shown, interconnect 140 further provides connectivity for network resources such as servers for data storage, web servers or the like. These network resources are available for users of network 100 of FIG. 1, albeit access may be restricted.

According to one embodiment of the invention, network switch 120 comprises logic that supports bi-directional communications with APs $130_1$-$130_X$ over interconnect 140. Namely, network switch 120 receives messages from and transmitting messages to one or more targeted APs $130_1$, . . . , or $130_X$ over interconnect 140. According to one embodiment of the invention, interconnect 140 may be part of any type of wired network, including but not limited or restricted to Ethernet, Token Ring, Asynchronous Transfer Mode (ATM), or the like. As an example, upon receiving a wireless message, an AP (e.g., AP $130_1$) extracts information and places such information into a frame utilized by a wired network (e.g. Ethernet frame) for transmission to network switch 120.

II. Wireless Network Device With Heat Dissipation Unit

Figure 2:
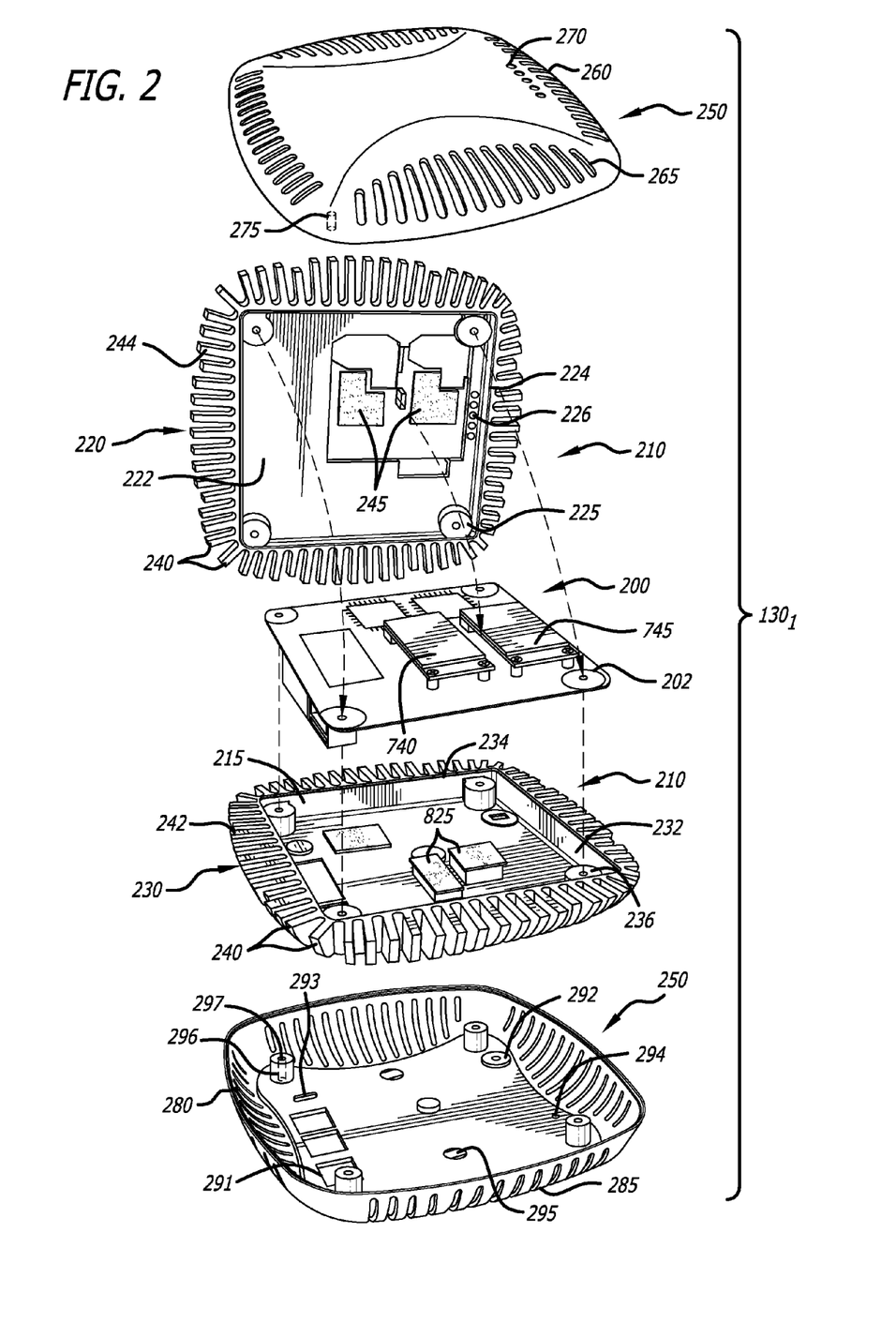
FIG. 2 is an exploded view of an exemplary embodiment of the wireless network device of FIG. 1, which includes wireless logic encased by a heat dissipation unit that, in turn, is surrounded by a casing.

Referring now to FIG. 2, an exploded view of an exemplary embodiment of wireless network device (e.g., access point $130_1$) of FIG. 1 is shown. Herein, wireless network device $130_1$ comprises wireless logic 200 encased by a heat dissipation unit 210 (e.g., a heat sink) that, in turn, is surrounded by a casing 250. As shown, wireless logic 200 is contained within a cavity 215 formed when one section 220 of heat dissipation unit 210 is placed over and mates with another section 230. Both first section 220 and second section 230 of heat dissipation unit 210 include heat-radiating elements 240 (e.g., fins 240) positioned around their peripheries in order to dissipate heat by convection. For clarity, these heat-radiating elements 240 are represented as a first set of fins 242 and a second set of fins 244 according to this embodiment of the invention.

As further shown in FIG. 2, wireless logic 200 comprises a circuit board 202 that is sized for placement within a polygon-shaped body 232 of second section 230. According to one embodiment of the invention, circuit board 202 is positioned below a top surface of a first flange 234 that extends laterally from two or more inner sidewalls of body 232 to create a recessed groove. The first set of fins 242 extends laterally from the outer sidewalls of body 232.

Additionally, according to one embodiment of the invention, first section 220 of heat dissipation unit 210 comprises a body 222 that is sized similarly to body 232. A second flange 224 extends vertically from at least two inner sidewalls of body 222 so that second flange 224 rests in the recessed groove formed by first flange 234. A sufficient amount of spacing is created between an inner top surface of body 222 and wireless logic 200 that is mounted on circuit board 202. The outer sidewalls of body 222 feature the second set of fins 244, which are aligned with first set of fins 242. A heat transfer path is provided by thermal pads 245 and 825, which are positioned to be in thermal contact with wireless logic 200 when body 222 is situated over circuit board 222 and when circuit board 202 is situated in second section 230. Heat radiating components (e.g., fins 240) provide thermal dissipation through convection.

Referring still to FIG. 2, casing 250 comprises an upper cover 260 and a lower cover 280. Upper cover 260 features a plurality of slots 265 that are oriented in an acutely angled (but generally horizontal) direction. Slots 265 are located near an edge portion of upper cover 260 in order to be aligned with the spacing areas formed between first and second sets of heat-radiating elements 242 & 244 (e.g., fins). Proximate to slots 265, light emitting diode (LED) lighting cones 270 are coupled to the interior surface of upper cover 260 and are positioned for insertion into predetermined apertures 226 placed near an edge of body 222, which is a part of first section 220 of heat dissipation unit 210. These apertures 226 are located above LEDs (not shown) situated on circuit board 202.

Additionally, the interior surface of upper cover 260 also features multiple bosses 275, which are partially illustrated in FIG. 2. These bosses 275 are sized for insertion into recesses 228 located along a corner area of body 222.

Lower cover 280 features a plurality of slots 285 that are (i) arc-shaped (but vertically oriented), (ii) located around its periphery, and (iii) aligned with spacing areas formed between both first and second sets of heat-radiating elements 242 and 244. Proximate to slots 285, lower cover 280 comprises a plurality of openings that include one or more of the following:

(1) one or more openings 291 that are adapted to provide access to predefined aperture(s) in heat dissipation unit 210 through which connectors are accessible. These connectors enable electrical communications between wireless logic 200 (encased by heat dissipation unit 210) and an external device (e.g., network switch);

(2) an opening 292 for receipt of a power connector;

(3) an opening 293 for a locking mechanism that is used to secure heat dissipation unit 210 to lower cover 280; and (4) an opening 294 for access to a reset button.

Mounting brackets 295 are positioned near the center of the outer surface of lower cover 280. Brackets 295 are used to secure wireless network device 130₁ to a substantially flat surface such as a wall or a ceiling.

Additionally, an interior surface of lower cover 280 comprises a plurality of bosses 296 that are adapted to protrude into recesses 236 located along a corner area of body 232. As a result, fastening members (e.g., screw, bolt, etc.) can be inserted through apertures 297 located behind bosses 296, through apertures in bosses 296 of lower cover 280, through apertures in recesses 236 of second section 230, through apertures in circuit board 202, through apertures in recesses 228 of first section 220, and attached to bosses 275 of upper cover 260.

Figure 3:
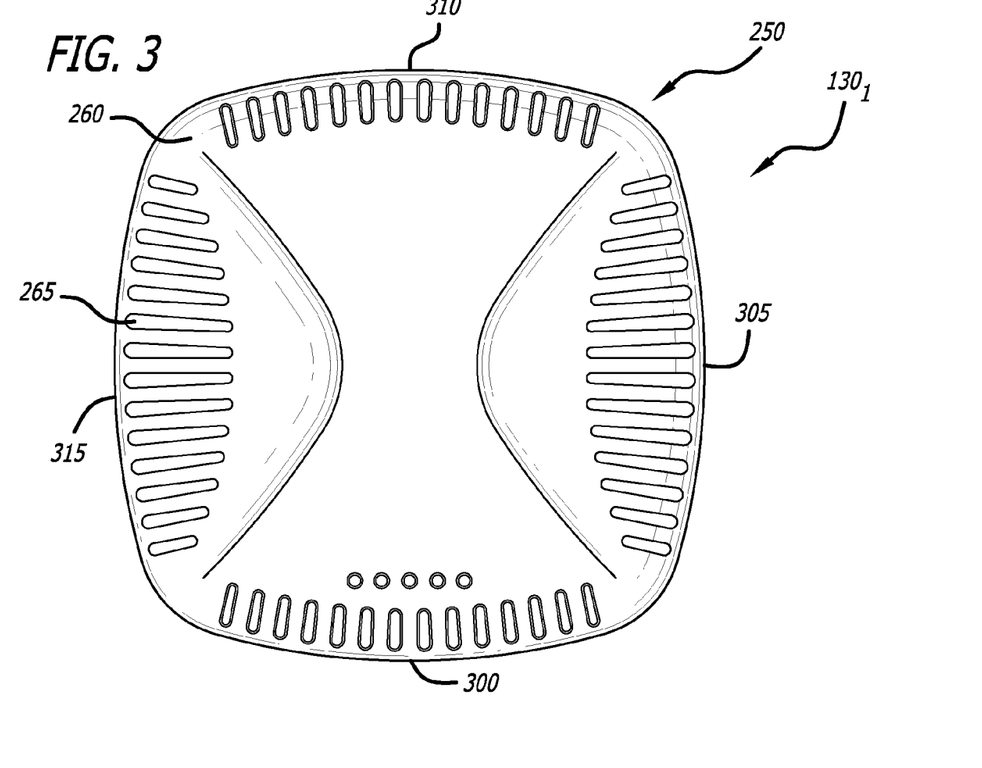
FIG. 3 is an overhead view of an exemplary embodiment of the wireless network device of FIG. 2.

Referring now to FIG. 3, an overhead view of an exemplary embodiment of wireless device 130₁ of FIG. 2 is shown. Herein, wireless device 130₁ comprises casing 250 that includes upper cover 260. As shown, upper cover 260 comprises slots 265 located proximate to its periphery, namely slots located along each side 300, 305, 310 and 315 of upper cover 260. According to this embodiment of the invention, slots 265 may vary in size. For instance, slots 265 along sides 300 and 310 are generally uniform and substantially aligned with the spacing areas between heat-radiating fins 244 of FIG. 2. Slots along sides 305 and 315 vary in size with a portion of these slots aligned downwardly with the spacing areas between heat-radiating fins 244 of FIG. 2 while the remaining portion of these slots are situated above body 222 of first section 220 of heat dissipation unit 210.

Figure 4:
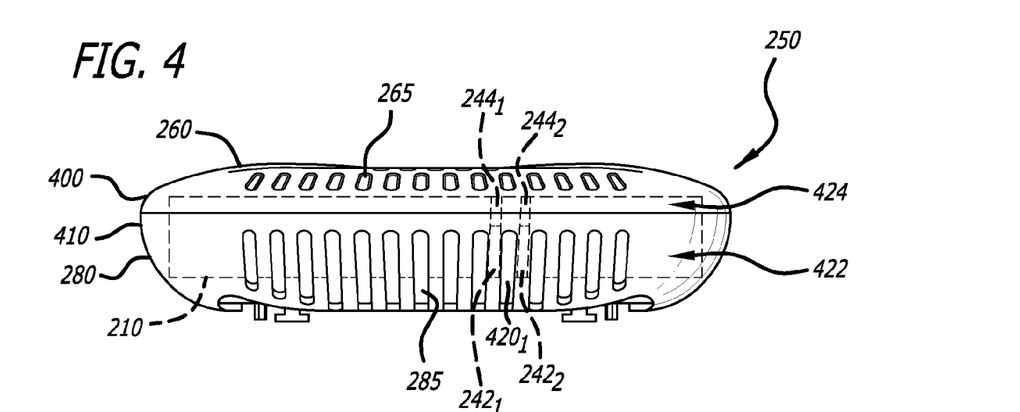
FIG. 4 is a front side view of an exemplary embodiment of the wireless network device of FIG. 3.

Referring to FIG. 4, a front side view of an exemplary embodiment of wireless device 130₁ of FIG. 3 is shown. Herein, wireless device 130₁ comprises casing 250 that includes edges 400 of upper cover 260 corresponding in shape to edges 410 of lower cover 280. Hence, according to this embodiment of the invention, casing 250 completely surrounds and covers heat dissipation unit 210. Additionally, casing 250 includes slots 265 in upper cover 260 aligned in a generally downward direction with spacing area between heat-radiating fins 242 & 244 and slots 285 in lower cover 280 that are aligned in an upward facing and lateral directions with spacing area between heat-radiating fins 242 & 244. Slots 265 and 285 correspond in number and position in order to encourage air flow through these slots and through the spacing areas between heat-radiating fins 242 and 244.

Figure 5:
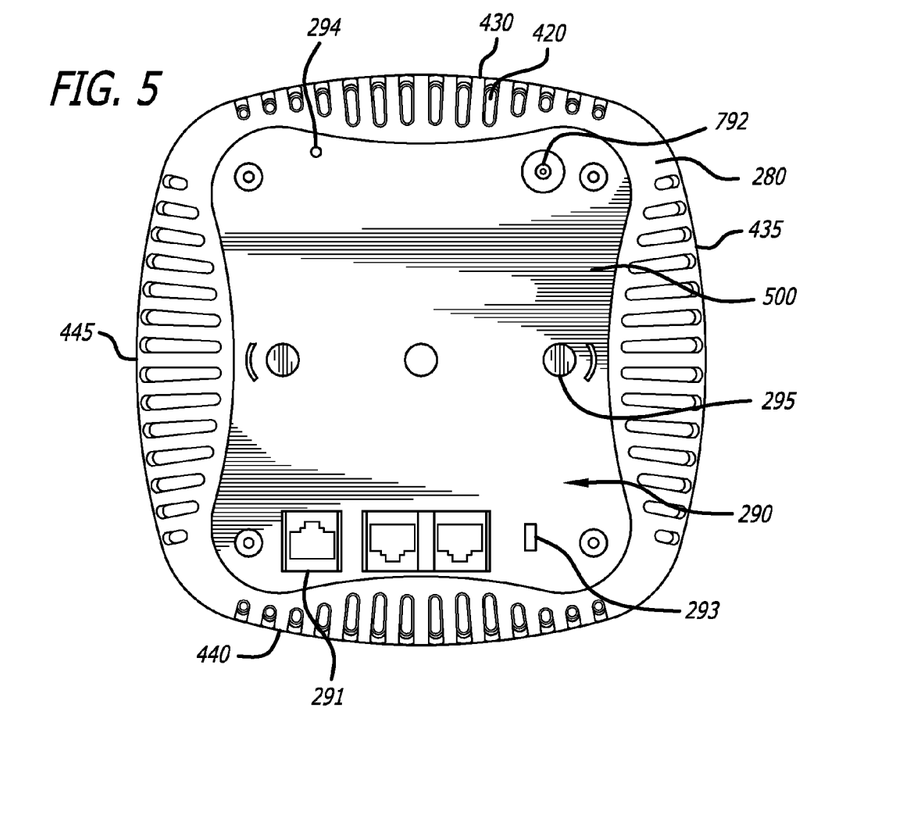
FIG. 5 is a bottom view of an exemplary embodiment of the wireless network device of FIG. 3.

In particular, as shown in FIG. 5, lower cover 280 comprises slots 285 located around its periphery, namely slots 420 located along a front side 430 of wireless device 130₁, which may be similar to those slots (not shown) located along the other sides 435, 440 and 445 of lower cover 280. According to this embodiment, slots 420 may vary in size based on differences in the length of each corresponding set of heat-radiating elements (e.g. fins) 242 and 244.

For instance, as illustrated in FIGS. 4 and 5, a lower portion 422 of slot 420₁ is aligned with a spacing area between two neighboring heat-radiating fins 242₁ and 242₂ of second section 230 for heat dissipating unit 210. An upper portion 424 of slot 420₁ is aligned with a spacing area between two neighboring heat-radiating fins 244₁ and 244₂ of first section 220 for heat dissipating unit 210, which are aligned with neighboring heat-radiating fins 242₁ and 242₂, respectively. Differences in fin sizes warrant differences in slot sizes as the area between the fins will be different as well.

Referring now to FIG. 5, a bottom view of an exemplary embodiment of wireless device 130₁ in FIG. 3 is shown. As described, wireless device 130₁ comprises casing 250 that includes lower cover 280 having a bottom surface 500. Mounting brackets 295, positioned along a mid-section of bottom surface 500, are used to secure wireless network device 130₁ to a wall, a ceiling or another substantially flat surface. Besides mounting bracket 295, bottom surface 500 of wireless device 130₁ is adapted with a plurality of openings 290 to allow for wired connectivity, a supply of power, and fastening.

For instance, according to this embodiment of the invention, openings 290 may include opening 291 that is sized to allow for insertion of one or more connectors into one or more corresponding inputs (e.g. any registered jack "RJ-xx" such as RJ-11, RJ-14, RJ-21, RJ-45, RJ-48, RJ-49, RJ-61; Universal Serial Bus "USB" port, etc.).

For the supply of power, it is contemplated that another opening 292 may be placed within bottom surface 500 of lower cover 280 to allow for insertion and coupling of a female direct current (DC) power connector (e.g., direct current "DC" connector) to a male DC connector located within a cylindrical aperture within body 232 of second section 230 shown in FIG. 2. This enables a supply of external power to wireless logic 200 within wireless network device 130₁. Of course, it is contemplated that other power connectors may be used in lieu of the DC power connector as illustrated.

It is further contemplated that another opening 293 may be placed within bottom surface 500 of lower cover 280 to enable second section 230 of heat dissipation unit 210 to be secured to lower cover 280. As a result, heat dissipation unit 210 is secured to that portion of wireless network device 130₁ secured to a surface, thereby preventing a situation where heat dissipation unit 210 becomes dislodged from casing 250. This may be accomplished by implementing a locking mechanism that is positioned within casing 250 near an inner surface of bottom surface 500 or externally from casing 250.

Lastly, it is contemplated that another opening 294 may be placed within bottom surface 500 of lower cover 280 to enable access to a reset button. This provides a mechanism for an administrator or user to reset the functionality of wireless network device 130₁.

Figure 6:
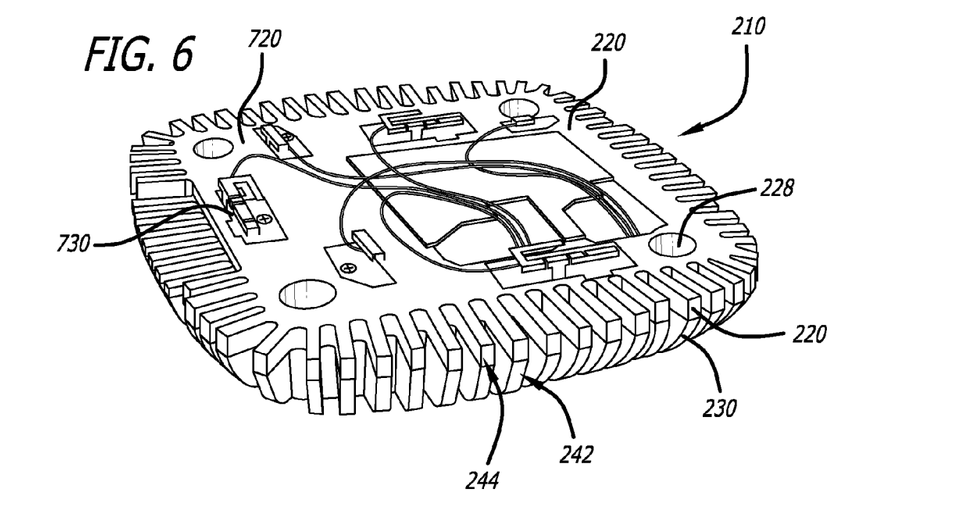
FIG. 6 is a perspective view of an exemplary embodiment of the heat dissipation unit for the wireless network device of FIG. 2.

FIG. 6 is a perspective view of an exemplary embodiment of heat dissipation unit 210 for wireless network device 130₁ of FIG. 2. As shown, according to one embodiment of the invention, heat dissipation unit 210 is configured as a heat sink that radiates (by convection) heat generated by wireless logic (not shown) encased by the heat sink. Heat dissipation unit 210 comprises first section 220 that is placed over and mates with second section 230. Both sections 220 and 230 are made of a material supporting thermal conductivity, such as an aluminum alloy or another metal alloy.

Figure 7A:
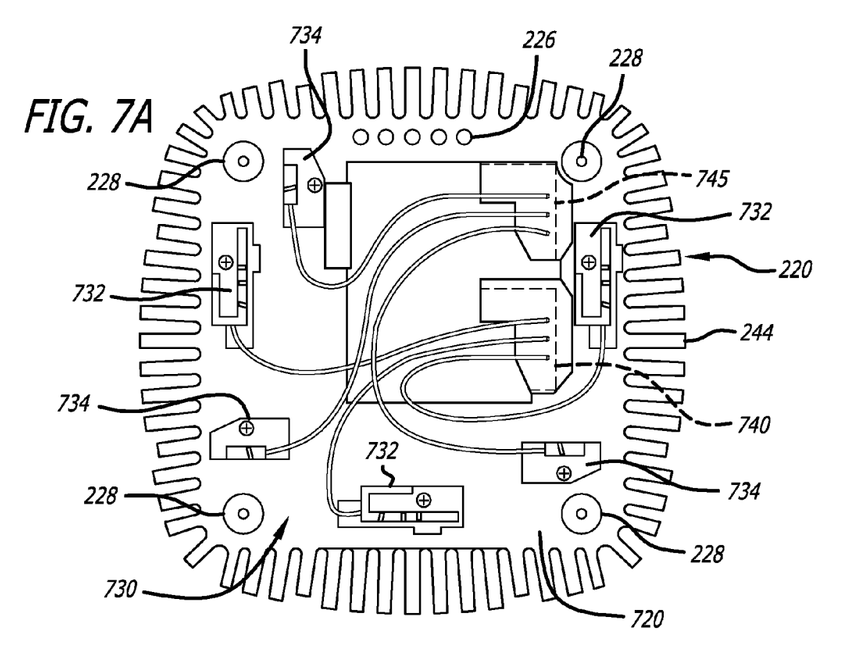
FIGS. 7A & 7B are exemplary embodiments of a top and bottom surface of a first section of the heat dissipation unit of FIG. 6.
Figure 7B:
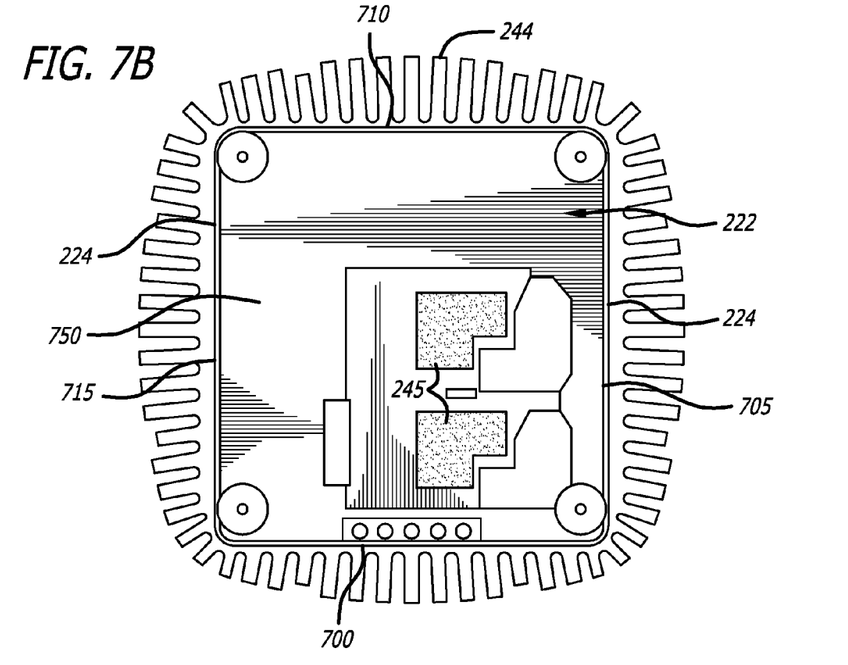
Figure 8A:
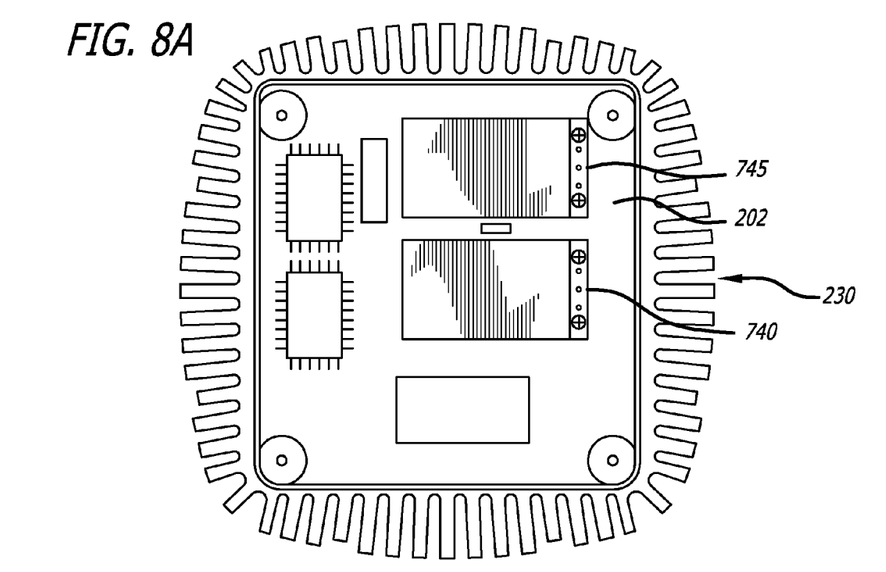
FIGS. 8A, 8B and 8C are exemplary embodiments of a top and bottom surface of a second section of the heat dissipation unit of FIG. 6.
Figure 8B:
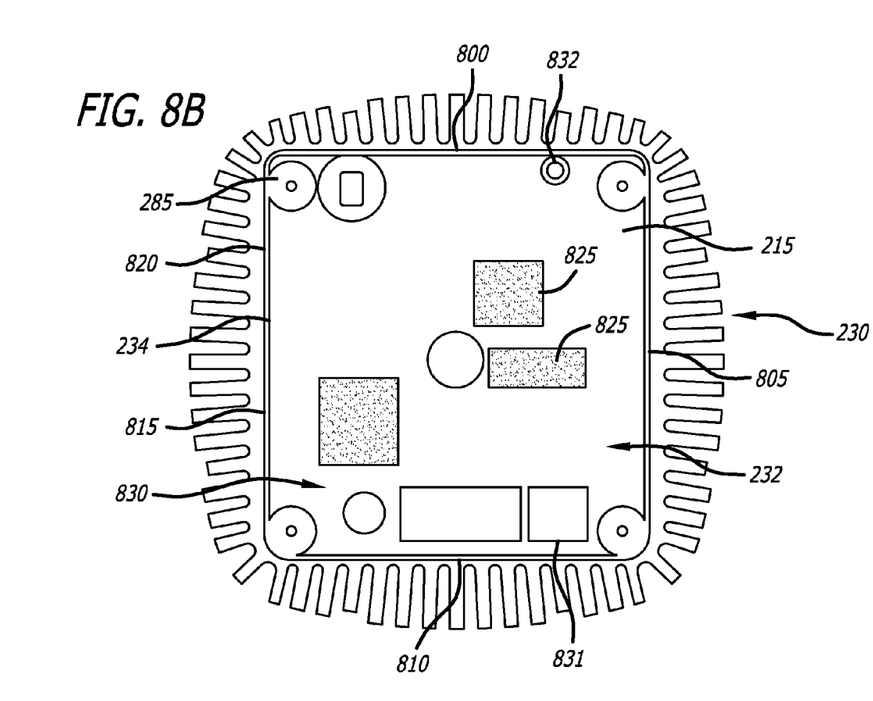

As shown in FIGS. 6, 7B and 8B, second section 230 includes body 232 with the first set of fins 242 positioned around its periphery and extending laterally therefrom. Second section 230 is configured for allowing connectivity to a wired network. Likewise, first section 220 includes body 222 with the second set of fins 244 positioned around its periphery. Both sets of fins 242 and 244 are configured to dissipate heat by convection. First section 220 is configured for allowing connectivity to a wireless network as described below.

Referring now to FIGS. 7A & 7B, exemplary embodiments of the top and bottom surfaces of first section 220 for heat dissipation unit 210 is shown. Herein, as shown in FIG. 7A, first section 220 includes body 222 that partially encases wireless logic with fins 244 extending laterally from sidewalls 700, 705, 710 and 715 of body 222. Body 222 comprises apertures 226 that operate as conduits for light emitted by light emitting diodes (LEDs) that are situated near one end of a conduit. Body 222 further comprises recesses 228 placed within a top exterior surface 720 of first section 220, which are located within corner areas of body 222 according to this embodiment. Recesses 228 are adapted to receive bosses (not shown) projecting from the interior surface of the upper cover and attached together by fastening elements.

As further shown in FIG. 7A, a plurality of antennae 730 are positioned on a top exterior surface 720 to receive wireless signaling and transmit such signaling to wireless logic 200. In particular, according to this embodiment of the invention, a first plurality of antennae 732 are coupled to a first chipset 740 and a second plurality of antennae 734 are coupled to a second chipset 745. Chipsets 740 and 745 form part of wireless logic 200.

Herein, as shown in FIG. 7B, first section 220 includes body 222 that partially encases wireless logic with fins 244 extending laterally from sidewalls 700, 705, 710 and 715 of body 222. A bottom interior surface 750 of body 222 is concave in shape to provide sufficient spacing between surface 750 and the encased wireless logic. According to this embodiment of the invention, second flange 224 is situated along all of an inner region of sidewalls 700, 705, 710 and 715 for insertion into the recessed groove formed within an interior region of second section 230. As a result, side walls 700, 705, 710 and 715 of first section 220 come into contact with the sidewalls of second section 230 shown below.

Heat transfer element(s) 245, such as a thermal pad(s), is coupled to an interior surface of body 222 (e.g., bottom surface 750) and transfers heat from the wireless logic. This creates a thermal dissipation path from the wireless logic to heat-radiating elements 244.

Figure 8C:
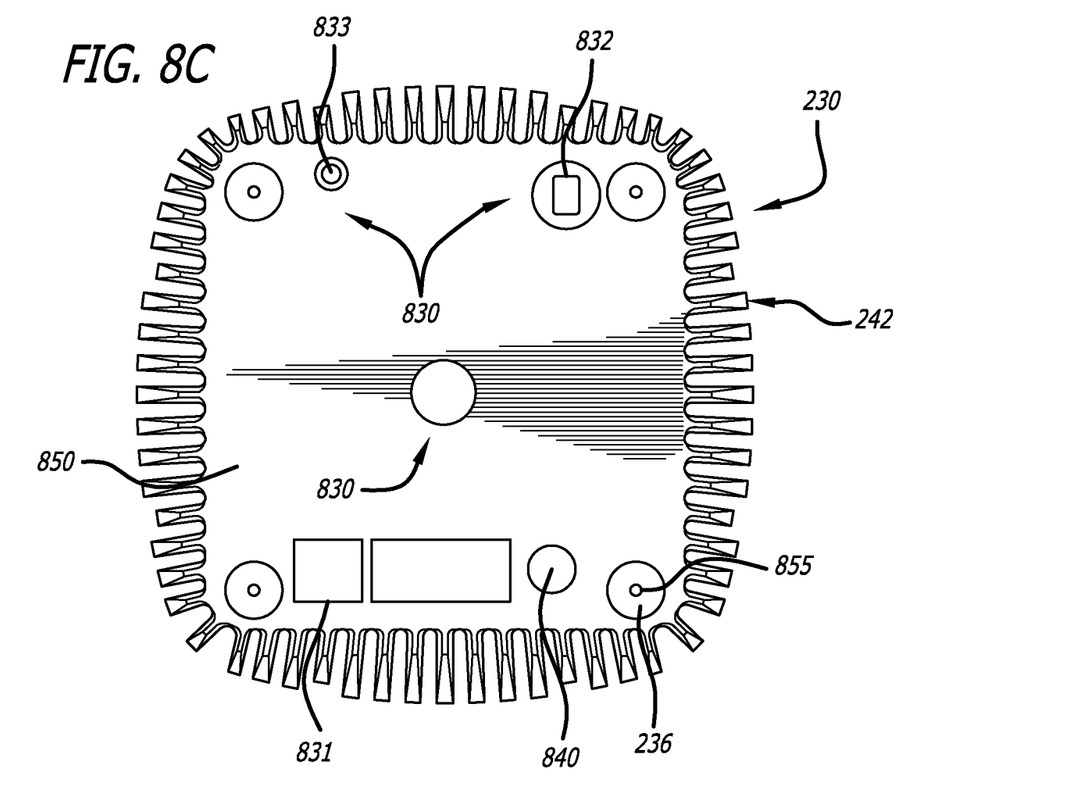

Referring to FIGS. 8A-8C, exemplary embodiments of a top and bottom surface of second section 230 of heat dissipation unit 210 of FIG. 6 is shown. Herein, as shown in FIGS. 8A and 8B, second section 230 includes body 232 that partially encases wireless logic with fins 242 extending laterally from sidewalls 800, 805, 810 and 815 of body 232. Circuit board 202 rests within an interior surface 820 of body 232 below second flange 234 that forms a recessed groove along sidewall 800, 805, 810 and 815.

As further shown in FIGS. 8A & 8B, circuit board 202 is supported and maintained level by supportive thermal members 825 positioned along interior surface 820. Support members provide sufficient spacing between interior surface 820 and circuit board 202 to allow RJ-connectors and other circuitry and mechanisms to be substantially contained within heat dissipation unit 210 and provide a thermal heat path from the wireless logic to second section 230.

Further shown in FIG. 8C, second section 230 features a plurality of openings 830 that correspond to some or all of openings 290 in casing 250 of FIG. 5. For instance, opening 831 corresponds to opening 291 and also is sized to allow for insertion of one or more connectors therethrough (e.g. RJ-xx jacks, USB ports, etc.).

For the supply of power, it is contemplated that another opening 832 may be placed within second section 230 to expose a direct current (DC) power connector (e.g., direct current "DC" connector). This enables external power to be supplied to wireless logic 200 within wireless network device 130₁.

It is further contemplated that opening 833 may be placed within second section 230 to expose a reset button. This reset button provides a mechanism to reset the functionality of wireless network device 130₁.

As further shown in FIG. 8C, it is contemplated that multiple recesses 236 and 840 may be placed within an exterior bottom surface 850 of second section 230. According to this embodiment of the invention, recesses 236 are located along a corner area of body 232 although other locations may be used. Apertures 855 are in the recesses to allow for fastening members (e.g., screw, bolt, etc.) to be inserted there through for securing heat dissipation unit 210 and casing 250 together. Recess 840 may be a location within which a locking mechanism (not shown) is deployed to avoid the casing (not shown) from being separated from the heat dissipation unit.

Figure 9:
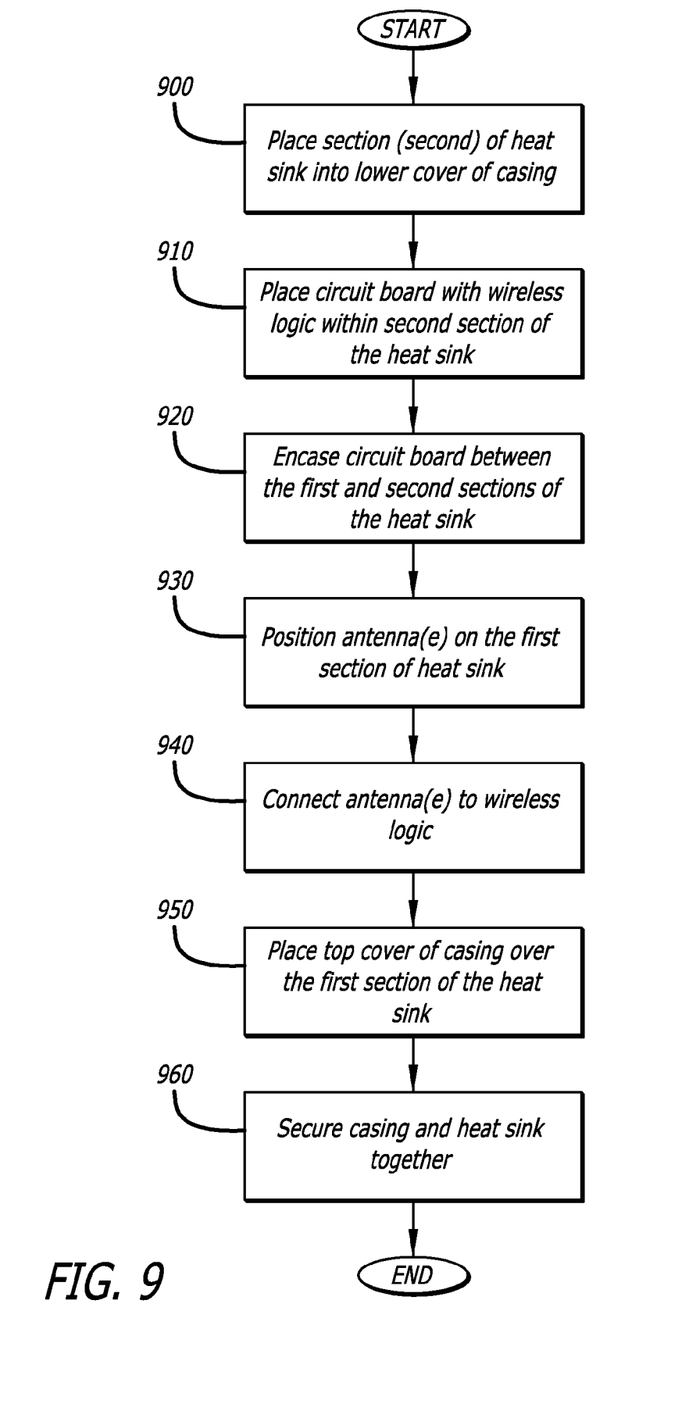
FIG. 9 is an exemplary embodiment of a method of formulating the access point of FIG. 1.

Referring now to FIG. 9, an exemplary embodiment of a method of assembling the access point of FIG. 1 is shown. First, one section (e.g., second section) of a heat dissipation unit (e.g., heat sink) is placed within a lower cover of the casing (block 900). Thereafter, a circuit board with wireless logic is positioned within the second section of the heat sink and subsequently encased by another section of the heat sink (e.g., first section) as illustrated in blocks 910 and 920. Thereafter, antenna(e) are positioned on a top surface of the first section of the heat sink (block 930). Of course, it is contemplated that the antenna(e) may be positioned on a bottom surface of the second section. Interconnects are used to connect the antenna(e) to the wireless logic through feed areas within the first section (block 940). Thereafter, an upper cover of the casing is placed over the first section of the heat sink so that the casing encases the heat sink, which encases the wireless logic (block 950). Fastening elements are inserted through areas within at least the casing and the heat sink to secure these elements together (block 960).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as determined by the appended claims and their equivalents. The description is thus to be regarded as illustrative instead of limiting.

What is claimed is:

1. An apparatus comprising:
   a heat dissipation unit comprising a first plurality of heat-radiating elements;
   a casing encasing the heat dissipation unit, a plurality of holes in the casing being aligned with spaces between the plurality of heat radiating elements;
   wherein the heat dissipation unit comprises a first section and a second section that is in physical contact with the first section,
   wherein the first section including a first body and the first plurality of heat-radiating elements positioned around a periphery of the first body,
   wherein the second section including (a) a second body having an aperture to provide access to a connector for electronics encased by the heat dissipation unit and (b) a second plurality of heat-radiating elements positioned around a periphery of the second body and aligned with the first plurality of heat-radiating elements.

2. The apparatus of claim 1 wherein the plurality of holes in the casing comprise a plurality of slots.

3. The apparatus of claim 1, wherein the casing comprises an upper cover and a lower cover, the upper cover includes the plurality of holes and the lower cover includes additional holes aligned with spaces between the second plurality of heat-radiating elements.

4. The apparatus of claim 1, wherein the heat dissipation unit is a heat sink.

5. The apparatus of claim 1, wherein the first body of the first section includes a plurality of recesses and the second body of the second section includes a plurality of recesses aligned with the plurality of recesses for the first section, wherein each of the plurality of recesses for the first body and each of the plurality of recesses for the second body includes an aperture adapted in size to receive a fastening element for securing the first section to the second section.

6. The apparatus of claim 1 wherein the upper cover includes a plurality of protrusions corresponding in size and location to the plurality of recesses of the first body for insertion therein, and the lower cover includes a plurality of protrusions corresponding in size and location to the plurality of recesses of the second body for insertion therein.

7. The apparatus of claim 1, further comprising heat generating electronics, wherein heat is transferred from the heat generating electronics to the heat dissipation unit via direct or indirect thermal contact.

8. An apparatus comprising;
a heat dissipation unit comprising a first plurality of heat-radiating elements;
a casing encasing the heat dissipation unit, a plurality of holes in the casing being aligned with spaces between the plurality of heat radiating elements;
heat generating electronics, wherein the heat dissipation unit encases the heat generating electronics.

9. The apparatus of claim 7 or 8, wherein the heat generating electronics comprise a circuit board and components attached to the circuit board.

10. The apparatus of claim 1, wherein a shape of the casing is substantially similar to the shape of the head dissipation unit.

11. The apparatus of claim 1, wherein the apparatus is a Wireless Access Point.

12. The apparatus of claim 1, wherein a first hole of the plurality of holes is different in shape than a second hole of the plurality of holes.

13. The apparatus of claim 1, wherein a first hole of the plurality of holes is different in size than a second hole of the plurality of holes.

14. The apparatus of claim 1, wherein the casing comprises an upper cover and a lower cover, wherein the plurality of holes comprises pairs of holes, wherein a first hole in each pair of holes is located on the upper cover and the second hole in that pair of holes is located directly opposite on the lower cover.

15. The apparatus of claim 1, wherein each of at least a subset of spaces between the first plurality of head-radiating elements is aligned with at least two holes of the one or more holes in the casing.

16. The apparatus of claim 1 further comprising (a) heat generating electronics and (b) a plurality of antennae positioned on a top surface of the first section of the heat dissipation unit, the top surface facing in a direction opposite from a bottom surface of the first section that faces the electronics.

17. The apparatus of claim 8 wherein the plurality of holes in the casing comprise a plurality of slots.

18. The apparatus of claim 8, wherein the heat dissipation unit is a heat sink.

19. The apparatus of claim 8, wherein a shape of the casing is substantially similar to the shape of the head dissipation unit.

20. The apparatus of claim 8, wherein the apparatus is a Wireless Access Point.

21. The apparatus of claim 8, wherein a first hole of the plurality of holes is different in shape than a second hole of the plurality of holes.

22. The apparatus of claim 8, wherein a first hole of the plurality of holes is different in size than a second hole of the plurality of holes.

23. The apparatus of claim 8, wherein the casing comprises an upper cover and a lower cover, wherein the plurality of holes comprises pairs of holes, wherein a first hole in each pair of holes is located on the upper cover and the second hole in that pair of holes is located directly opposite on the lower cover.

24. The apparatus of claim 8, wherein the heat dissipation unit encases the heat generating electronics on at least two sides of the heat generating electronics.

25. The apparatus of claim 8, wherein each of at least a subset of spaces between the first plurality of head-radiating elements is aligned with at least two holes of the one or more holes in the casing.

26. The apparatus of claim 8,
wherein the heat dissipation unit comprises a first section and a second section that is in physical contact with the first section,
wherein the first section including a first body and the first plurality of heat-radiating elements positioned around a periphery of the first body, and
wherein the second section including (a) a second body having an aperture to provide access to a connector for electronics encased by the heat dissipation unit and (b) a second plurality of heat-radiating elements positioned around a periphery of the second body and aligned with the first plurality of heat-radiating elements.

* * * * *